(12) United States Patent
Ikebe

(10) Patent No.: US 9,571,113 B2
(45) Date of Patent: Feb. 14, 2017

(54) INTEGRAL A/D CONVERTER AND CMOS IMAGE SENSOR

(71) Applicant: NATIONAL UNIVERSITY CORPORATION HOKKAIDO UNIVERSITY, Sapporo-shi, Hokkaido (JP)

(72) Inventor: Masayuki Ikebe, Sapporo (JP)

(73) Assignee: NATIONAL UNIVERSITY CORPORATION HOKKAIDO UNIVERSITY, Sapporo-shi, Hokkaido (JP)

( * ) Notice: Subject to any disclaimer, the term of this patent is extended or adjusted under 35 U.S.C. 154(b) by 243 days.

(21) Appl. No.: 14/379,120

(22) PCT Filed: Feb. 15, 2013

(86) PCT No.: PCT/JP2013/053734
§ 371 (c)(1),
(2) Date: Aug. 15, 2014

(87) PCT Pub. No.: WO2013/122221
PCT Pub. Date: Aug. 22, 2013

(65) Prior Publication Data
US 2015/0014517 A1 Jan. 15, 2015

(30) Foreign Application Priority Data
Feb. 17, 2012 (JP) ................................. 2012-033196

(51) Int. Cl.
*H03M 1/00* (2006.01)
*G04F 10/00* (2006.01)
(Continued)

(52) U.S. Cl.
CPC ............ *H03M 1/002* (2013.01); *G04F 10/005* (2013.01); *H03M 1/14* (2013.01); *H03M 1/56* (2013.01); *H04N 5/378* (2013.01); *H04N 5/374* (2013.01)

(58) Field of Classification Search
CPC .......... H03M 1/14; H03M 1/00; H03M 1/002; H03M 1/56; G04F 10/005; G04F 10/00; H04N 5/378; H04N 5/374
See application file for complete search history.

(56) References Cited

U.S. PATENT DOCUMENTS

| | | | | |
|---|---|---|---|---|
| 5,101,206 A | * | 3/1992 | Riedel | ..................... H03M 1/14 341/120 |
| 7,075,353 B1 | * | 7/2006 | Wan | .......................... G06F 1/04 327/295 |

(Continued)

FOREIGN PATENT DOCUMENTS

| | | |
|---|---|---|
| JP | 2008-522258 A | 6/2008 |
| JP | 2010-225738 A | 10/2010 |

(Continued)

OTHER PUBLICATIONS

Communication dated Nov. 26, 2015 from the European Patent Office in counterpart application No. 13749907.5.

(Continued)

*Primary Examiner* — John Lee
(74) *Attorney, Agent, or Firm* — Sughrue Mion, PLLC

(57) ABSTRACT

The integral type Analog/Digital (AD) converter includes: a comparator configured to compare a reference voltage of a ramp waveform with an input voltage and output a comparison signal; a DLL circuit configured to generate a plurality of clock signals; a delay adjustment circuit configured to delay the comparison signal; a counter configured to count a time from starting of changing of the ramp waveform to the inversion of the outputting from the delay adjustment circuit and output the counted result as a high-order bit; and a TDC configured to latch and decode the (Continued)

plurality of clock signals when the output of the delay adjustment circuit is inverted and output the latched and decoded result as a low-order bit, wherein the TDC starts an operation thereof by the inversion of the comparison signal, and stops the operation thereof by the inversion of the output signal of the delay adjustment circuit.

6 Claims, 13 Drawing Sheets

(51) Int. Cl.
*H03M 1/56* (2006.01)
*H04N 5/378* (2011.01)
*H03M 1/14* (2006.01)
*H04N 5/374* (2011.01)

(56) References Cited

U.S. PATENT DOCUMENTS

| | | | | |
|---|---|---|---|---|
| 7,671,317 | B2* | 3/2010 | Shimomura | H04N 5/3742 250/208.1 |
| 7,863,952 | B2* | 1/2011 | Friedman | H03L 7/1976 327/150 |
| 8,039,781 | B2* | 10/2011 | Shimomura | H04N 5/3742 250/208.1 |
| 8,456,554 | B2* | 6/2013 | Takahashi | H03M 1/14 250/208.1 |
| 8,742,969 | B2* | 6/2014 | Oo | H03M 1/1014 341/156 |
| 9,253,423 | B2* | 2/2016 | Shida | H04N 5/3658 |
| 2003/0235260 | A1* | 12/2003 | Nakamura | H03K 5/13 375/374 |
| 2009/0003114 | A1 | 1/2009 | Priel et al. | |
| 2009/0026352 | A1* | 1/2009 | Shimomura | H04N 5/378 250/214 R |
| 2010/0110252 | A1* | 5/2010 | Shimomura | H04N 5/378 348/302 |
| 2010/0271525 | A1 | 10/2010 | Takahashi | |
| 2011/0187907 | A1 | 8/2011 | Takahashi | |
| 2011/0292265 | A1* | 12/2011 | Takahashi | H04N 5/3745 348/308 |
| 2012/0092053 | A1* | 4/2012 | Narathong | H03L 7/091 327/159 |
| 2012/0176518 | A1* | 7/2012 | Yamazaki | H03M 1/14 348/241 |
| 2012/0244824 | A1* | 9/2012 | Entezari | H03L 7/1806 455/114.2 |
| 2012/0287316 | A1* | 11/2012 | Kim | H04N 5/378 348/294 |
| 2013/0068931 | A1* | 3/2013 | Iwaki | H01L 27/14609 250/208.1 |
| 2013/0342377 | A1* | 12/2013 | Lin | H03M 1/12 341/143 |
| 2014/0118583 | A1* | 5/2014 | Shida | H04N 5/3765 348/250 |
| 2015/0014517 | A1* | 1/2015 | Ikebe | H03M 1/14 250/208.1 |

FOREIGN PATENT DOCUMENTS

| | | |
|---|---|---|
| JP | 2010-258817 A | 11/2010 |
| JP | 2011-055196 A | 3/2011 |

OTHER PUBLICATIONS

Naraghi S et at, "A 9-bit, 14 I 1/4 W and 0.06 mm {>2} Pulse Position Modulation ADC in 90 nm Digital CMOS", IEEE Journal of Solid-State Circuits, IEEE Service Center, Piscataway, NJ, USA, vol. 45, No. 9, Sep. 1, 2010, p. 1870-p. 1880, XP011317124.

Muung Shin et al., "Column parallel single-slope ADC with time to digital converter for CMOS imager", Electronics, Circuits, and Systems (ICECS), 2010 17th IEEE International Conference On, IEEE, Dec. 12, 2010, p. 863-p. 866, XP031923091.

Written Opinion for PCT/JP2013/053734 dated May 14, 2013 [PCT/ISA/237].

Yukinonbu Makihara, Mhun Shin, Masayuki Ikebe, Junichi Motohisa, Eiichi Sano, "High Speed Ramp-Wave Generator with Interleaved DAC for Single-Slope ADC", ITE Techical Report vol. 34, No. 29, Jul. 23, 2010, p. 89-93.

International Preliminary Report on Patentability issued in International Application No. PCT/JP2013/053734 mailed Aug. 28, 2014.

* cited by examiner

INTEGRAL A/D CONVERTER AND CMOS IMAGE SENSOR

CROSS REFERENCE TO RELATED APPLICATIONS

This application is a National Stage of International Application No. PCT/JP2013/053734 filed Feb. 15, 2013, claiming priority based on Japanese Patent Application No. 2012-033196, filed Feb. 17, 2012, the contents of all of which are incorporated herein by reference in their entirety.

TECHNICAL FIELD

The present invention relates to an integral type Analog/Digital (AD) converter and a Complementary Metal Oxide Semiconductor (CMOS) image sensor.

BACKGROUND ART

An example of an integral type Analog/Digital (AD) converter used in a Complementary Metal Oxide Semiconductor (CMOS) image sensor, etc. is a single slope type AD converter. The single slope type AD converter compares an analog input voltage and a reference voltage having a ramp waveform linearly changed according to a time using a comparator, counts a time until an output of the comparator is inverted using a counter circuit, and outputs the counted result as a digital value.

An example of a technology of further speeding up the AD converter or further improving a precision of the AD converter is a technology of performing AD conversion by measuring a time when the output of the comparator is inverted in more detail using a Time to Digital Converter (TDC) and outputting the measured time together with the output of the counter.

For example, an integral type AD converter 101 disclosed in Non Patent Literature 1 includes a comparator 10, a counter 30, a TDC 140 and a Delay Locked Loop (DLL) 50 as illustrated in FIG. 11. An operation of the integral type AD converter 101 will be described with reference to FIG. 12. In the integral type AD converter 101, the comparator 10 compares an analog signal yin with a reference signal ramp having a ramp waveform linearly changed according to a time and outputs the compared result as an output voltage vcomp. As illustrated in FIG. 12A, the reference signal ramp is linearly changed according to a passing of time, and a magnitude relation between the analog input signal yin and the reference signal ramp is reversed at a time point $t_{inv}$. An output vcomp of the comparator 10 is inverted at the time point $t_{inv}$. The counter 30 counts a time up to the time point $t_{inv}$ based on a reference clock signal which is input, and outputs the counted result as an output result out2.

FIG. 12(b) illustrates a portion obtained by enlarging a portion around a time point $t_{inv}$ of FIG. 12(a). The TDC 140 measures a time period t within a period T corresponding to a reference clock, which is configured from a starting time point of the period T to the time point $t_{inv}$, and outputs the measured result as an output result out1. A detailed measuring method will be described with reference to FIG. 13. The DLL 50 outputs four clock signals CLKA, CLKB, CLKC and CLKD having the same frequency as that of a reference clock signal, and having different phases each of which is changed by 45 degrees. The TDC 140 latches values of the four clock signals CLKA, CLKB, CLKC and CLKD at the time point $t_{inv}$ when the output of the comparator 10 is inverted. For example, in FIG. 13, a magnitude relation between the analog input signal yin and the reference signal ramp is reversed at the time point $t_{inv}$, and the output vcomp of the comparator 10 is inverted. At this time, the clock signal CLKA is in a high level zone, the clock signals CLKB, CLKC and CLKD are in a low level zone, and the values of the clock signals CLKA, CLKB, CLKC and CLKD are latched. As described above, the TDC 140 measures a time of the time point $t_{inv}$ within one clock period in a time unit more minutely than the one clock period, using phase information indicating whether each of the clock signals CLKA, CLKB, CLKC and CLKD is in the high level zone or in the low level zone.

Further, an AD converter disclosed in Patent Literature 1 also includes the comparator 10, the counter 30, and the TDC 140, and performs the same processing as that of the integral type AD converter 101 disclosed in Non-Patent Literature 1.

CITATION LIST

Patent Literature

[Patent Literature 1] Japanese Patent Laid-Open Publication No. 2010-258817

Non Patent Literature

[Non-Patent Literature 1] Yukinobu Makihara, Mhun Shin, Masauki Ikebe, Junichi Motohisa, Eiichi Sano "High-speed ramp-wave generator with interleaved DAC for single-slope AD converter", Technical report of Institute of Image Information and Television Engineers, Jul. 23, 2010, Vol. 34, No. 29, pp. 89-93.

SUMMARY OF INVENTION

Technical Problem

However, in the related art, since the TDC 140 has a flip flop operated by a clock signal having a plurality of phases, the TDC has large power consumption, so that the integral type AD converter also has large power consumption. In particular, when a large number of clock signals are used in order to improve a conversion accuracy of the integral type AD converter, a problem occurs in which the power consumption of the integral AD converter is increased according to an increase in the number of the clock signals.

Accordingly, an aspect of the present invention is to provide an integral type AD converter and a CMOS image sensor which can reduce the power consumption while improving at least one of the conversion accuracy or conversion speed.

Solution to Problem

In order to solve the aforementioned problem, an aspect of the present invention provides an integral type Analog/Digital (AD) converter including a comparator configured to compare a reference voltage of a ramp waveform linearly changed according to a passing of time with an input voltage and output a comparison signal for the reference voltage and the input voltage; a multi-phase clock generation circuit configured to generate a plurality of clock signals including a main clock signal and clock signals having phases different from that of the main clock signal; a delay adjustment circuit configured to delay the comparison signal output from the comparator by a time period longer than one period of the main clock signal, and output the delayed comparison signal; a counter configured to count a time from starting of changing of the ramp waveform to the inversion of the outputting from the delay adjustment circuit, based on the signals output from the delay adjustment circuit and the main clock signal, and output the counted result as a high order bit; and a time to digital converter configured to latch the plurality of clock signals generated by the multi-phase clock generation circuit at a time point when the output signal of the delay adjustment circuit is inverted and output a result obtained by decoding the corresponding latched value as a low-order, wherein the time to digital converter starts an operation thereof at the time point when the comparison signal output from the comparator is inverted, and stops the operation thereof after the low-order bit is output at the time point when the output signal of the delay adjustment circuit is inverted.

According to such an integral type AD converter, the delay adjustment circuit delays the comparison signal output from the comparator by a time period longer than one period of the main clock signal and outputs the delayed signal, and the time to digital converter starts an operation thereof at a time point when the output signal of the comparator is inverted, and stops the operation thereof at a time point when the output signal of the delay adjustment circuit is inverted. Accordingly, the time to digital converter can be operated for a necessary time period which corresponds to at least one period of the main clock signal or more, so that power consumption can be reduced while improving at least one of a conversion accuracy and a conversion speed of the integral type AD converter.

Further, a CMOS image sensor according to an aspect of the present invention includes the integral type AD converter. According to this configuration, the integral type AD converter, which can reduce power consumption thereof while improving at least one of the conversion accuracy and the conversion speed, is used, so that the power consumption thereof can be reduced while improving an operation speed of the CMOS image sensor.

Advantageous Effects of Invention

According to the present invention, an integral type AD converter and a CMOS image sensor which can reduce the power consumption while improving at least one of the conversion accuracy or conversion speed can be obtained.

DESCRIPTION OF EMBODIMENTS

Figure 1:
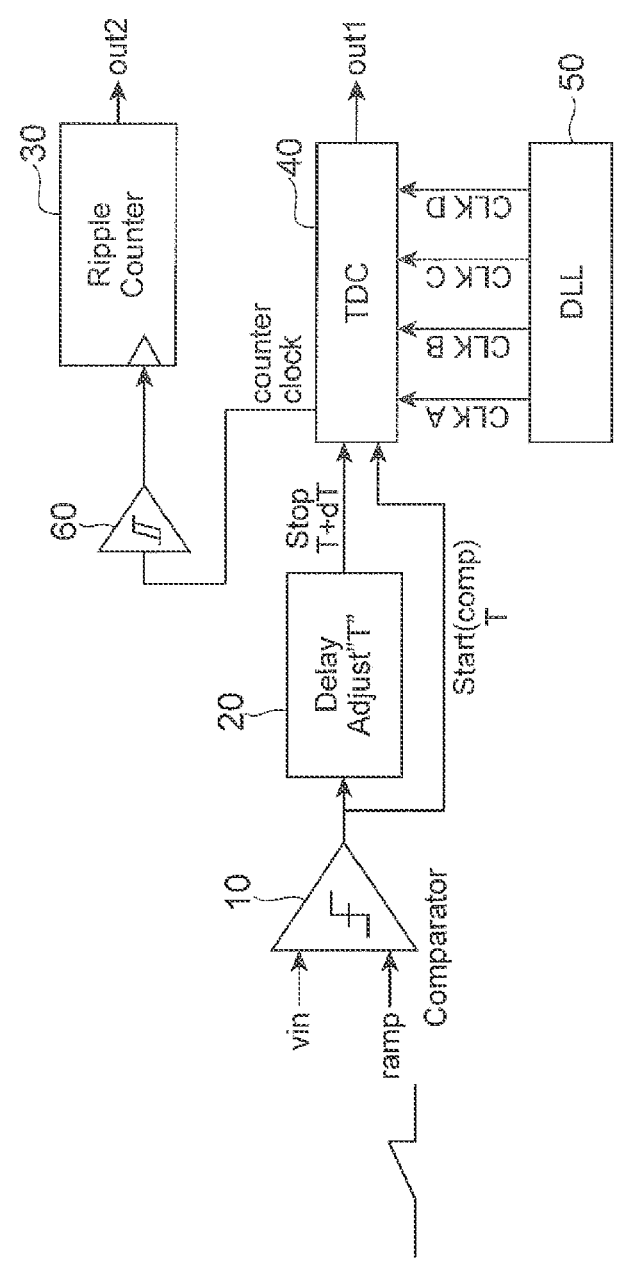
FIG. 1 illustrates a configuration of an integral type AD converter according to the present embodiment.

Hereinafter, a suitable embodiment of an integral type AD converter according to the present invention will be described with reference to the accompanying drawings. Further, in the following description, the same portions or equivalent portions are designated by the same reference numerals, and a duplicated description will be omitted.

FIG. 1 illustrates a configuration of an integral type AD converter 1 according to an embodiment of the present invention. As illustrated in FIG. 1, the integral type AD converter 1 includes a comparator 10, a delay adjustment circuit 20, a ripple counter (counter) 30, a Time to Digital Converter (TDC) 40, a Delay Locked Loop (DLL; multi-phase clock generation circuit) 50, and a Schmitt trigger circuit 60. Hereinafter, each component of the integral type AD converter 1 will be described in detail.

Figure 12:
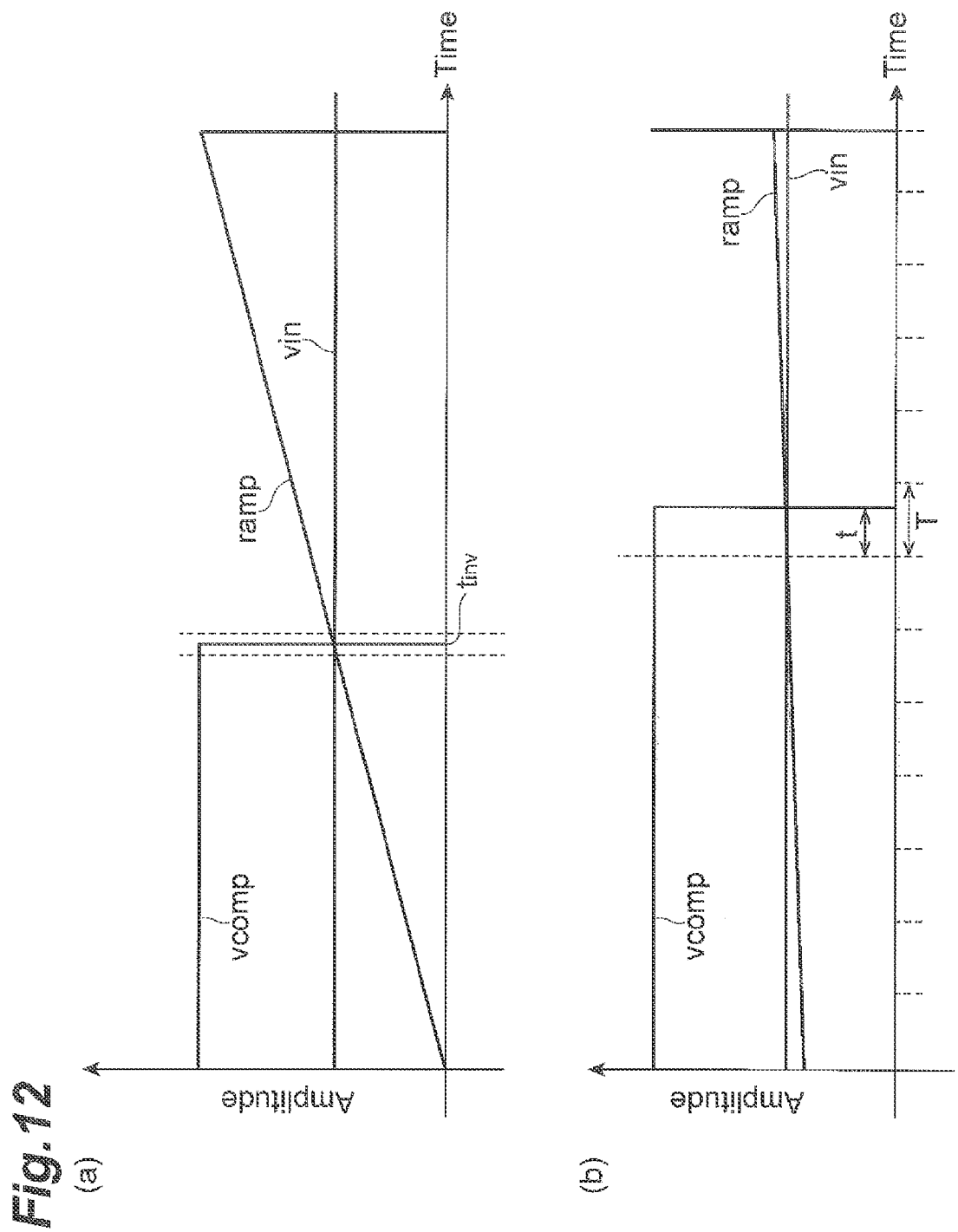
FIG. 12 is a timing diagram of the integral AD converter using the TDC according to the related art.
Figure 13:
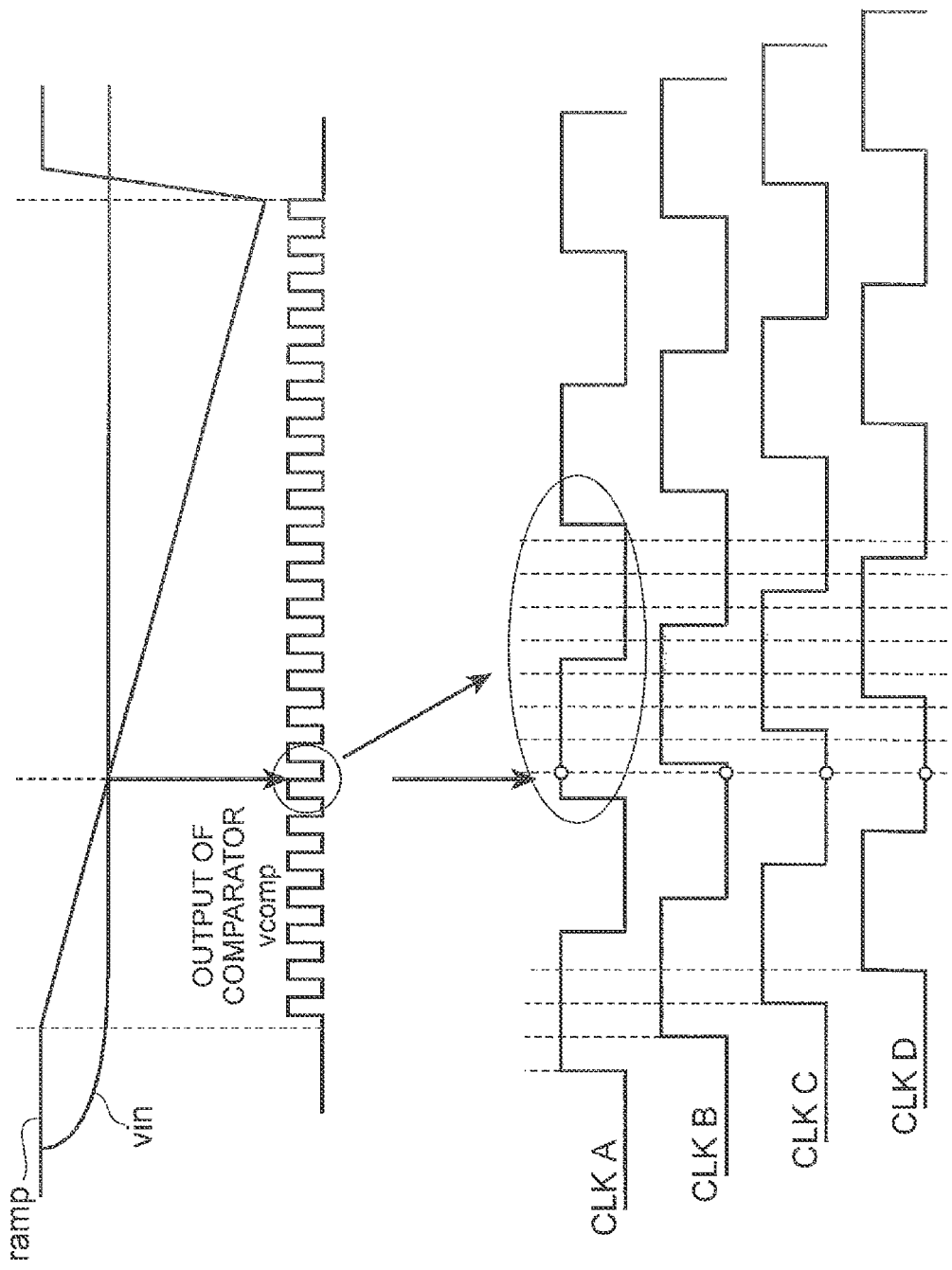
FIG. 13 is a timing diagram of the integral AD converter using the TDC according to the related art.

The comparator 10 receives a reference voltage ramp of a ramp waveform linearly changed according to a passing of time, and an analog input voltage yin. The comparator 10 compares the reference voltage ramp with the analog input voltage yin, and outputs a comparison signal. As illustrated in FIG. 12(a), at an initial time, the reference voltage ramp is lower than the analog input voltage yin, so that the comparison signal vcomp corresponding to an output of the comparator 10 is in a high level zone. Thereafter, when the reference voltage ramp increases and the time reaches a time point $t_{inv}$, a magnitude relation between the analog input signal yin and the reference signal ramp is reversed. The comparison signal vcomp corresponding to the output of the comparator 10 is inverted to be in a low level zone after the time point $t_{inv}$.

Figure 2:
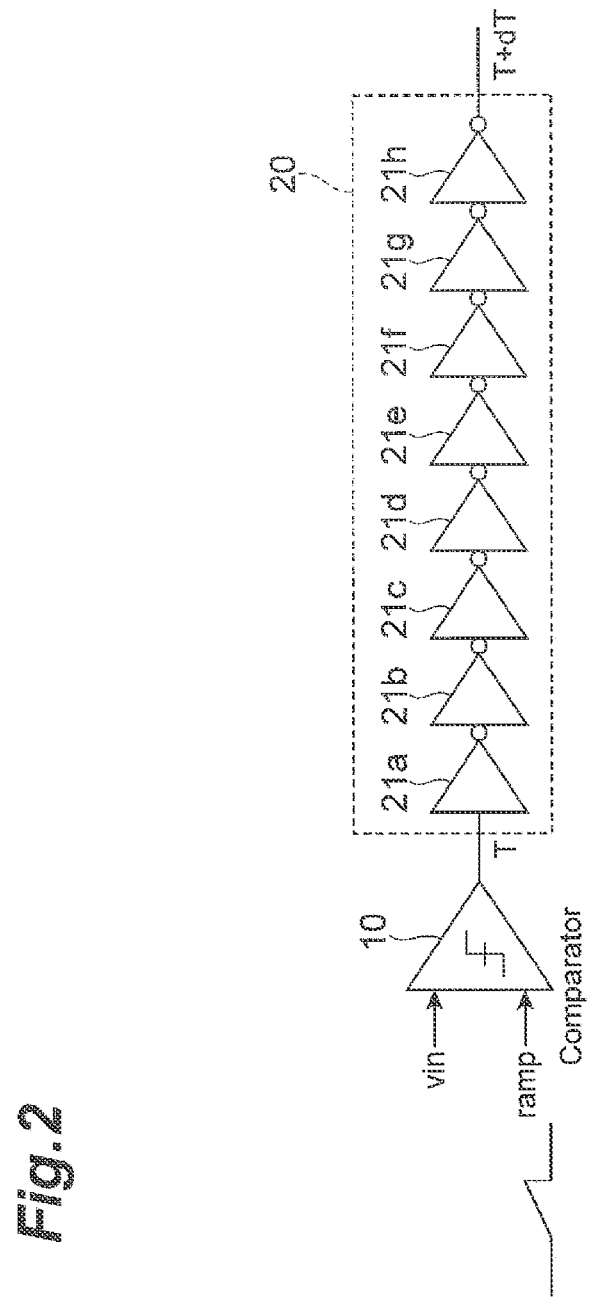
FIG. 2 illustrates a configuration of a delay adjustment circuit in the integral type AD converter according to the present embodiment.

FIG. 2 illustrates a configuration of a delay adjustment circuit 20 in an integral type AD converter 1 according to the present embodiment. The delay adjustment circuit 20 corresponds to a circuit which is installed at a rear end of the comparator 10 and delays and outputs the comparison signal. In the present embodiment, the delay adjustment circuit 20 corresponds to a delay line including 8-stage inverters 21a to 21h. The delay adjustment circuit 20 delays a comparison signal T output from the comparator 10 by a time dT, and outputs a delayed comparison signal T+dT. The time dT corresponds to a time longer than one period of a main clock signal generated by the DLL 50 which will be described below. Further, the stage number of the inverter 21 needs not be 8, and should be the stage number by which time delay longer than one period of the main clock signal is generated regardless of process variations.

Figure 3:
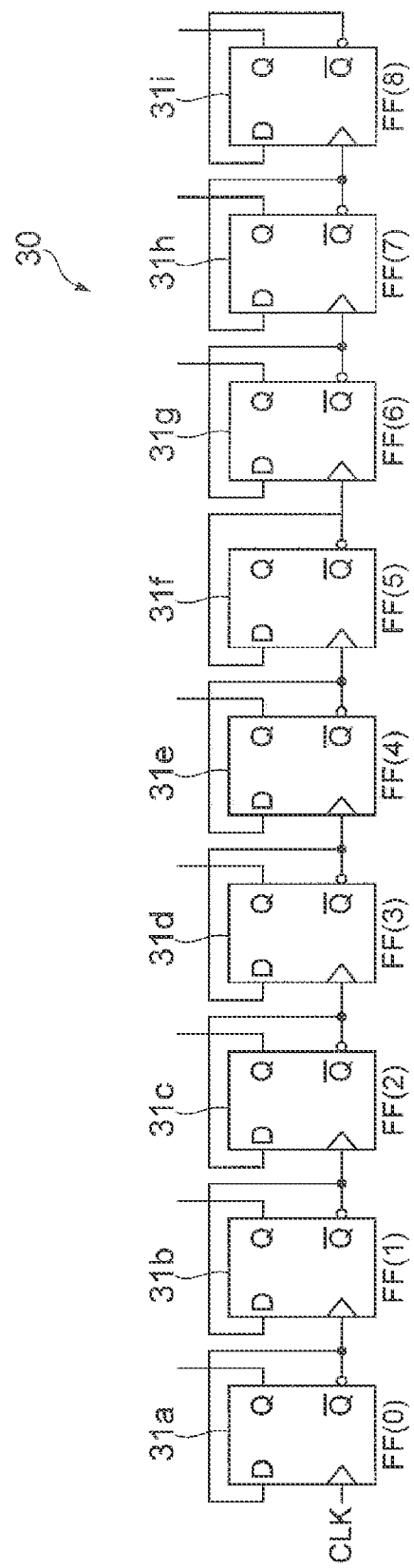
FIG. 3 illustrates a configuration of a ripple counter in the integral type AD converter according to the present embodiment.

FIG. 3 illustrates a configuration of a ripple counter 30 in the integral type AD converter 1 according to the present embodiment. The ripple counter 30 corresponds to a ripple counter having 9 bits. The ripple counter 30 is configured by cascade-connecting nine D-Flip Flops (D-FFs) 31a to 31i with each other. Inverted output ports Qb of the D-FFs 31a to 31i (in the drawing, a line is affixed and drawn on a character "Q", and so forth) are connected to data input ports D of the corresponding D-FFs 31a to 31i, respectively. Further, the inverted output ports Qb of the D-FFs 31a to 31h other than the last stage are also connected to clock input ports of the next D-FFs 31b to 31i, respectively. The ripple counter 30 is operated as follows. Values of an output port Q and an inverted output port Qb of the D-FF 31a corresponding to a first stage are changed from the high level zone to the low level zone or from the low level zone to the high level zone in accordance with a rise in the clock signal CLK input from the TDC 40. Values of output ports Q and inverted output ports Qb of the D-FF 31b to 31i corresponding to following stages are changed from the high level zone to the low level zone or from the low level zone to the high level zone in accordance with a rise in the inverted output of the D-FFs corresponding to the prior stages. Thus, the D-FF 31b corresponding to the second stage is changed once whenever the clock signal CLK input from the TDC 40 rises twice, and the D-FF 31c corresponding to the third stage is changed once whenever the clock signal input from the TDC 40 rises four times. In this way, the output ports Q of the D-FF 31a to 31i output values of nine bits of nine bit counter values, respectively. In the sequence of the values of the bits, a value of the output port Q of the D-FF 31a corresponding to the first stage is a bit value having the lowest order and a value of the output port Q of the D-FF 31i corresponding to the last stage is a bit value having the highest order.

Figure 4:
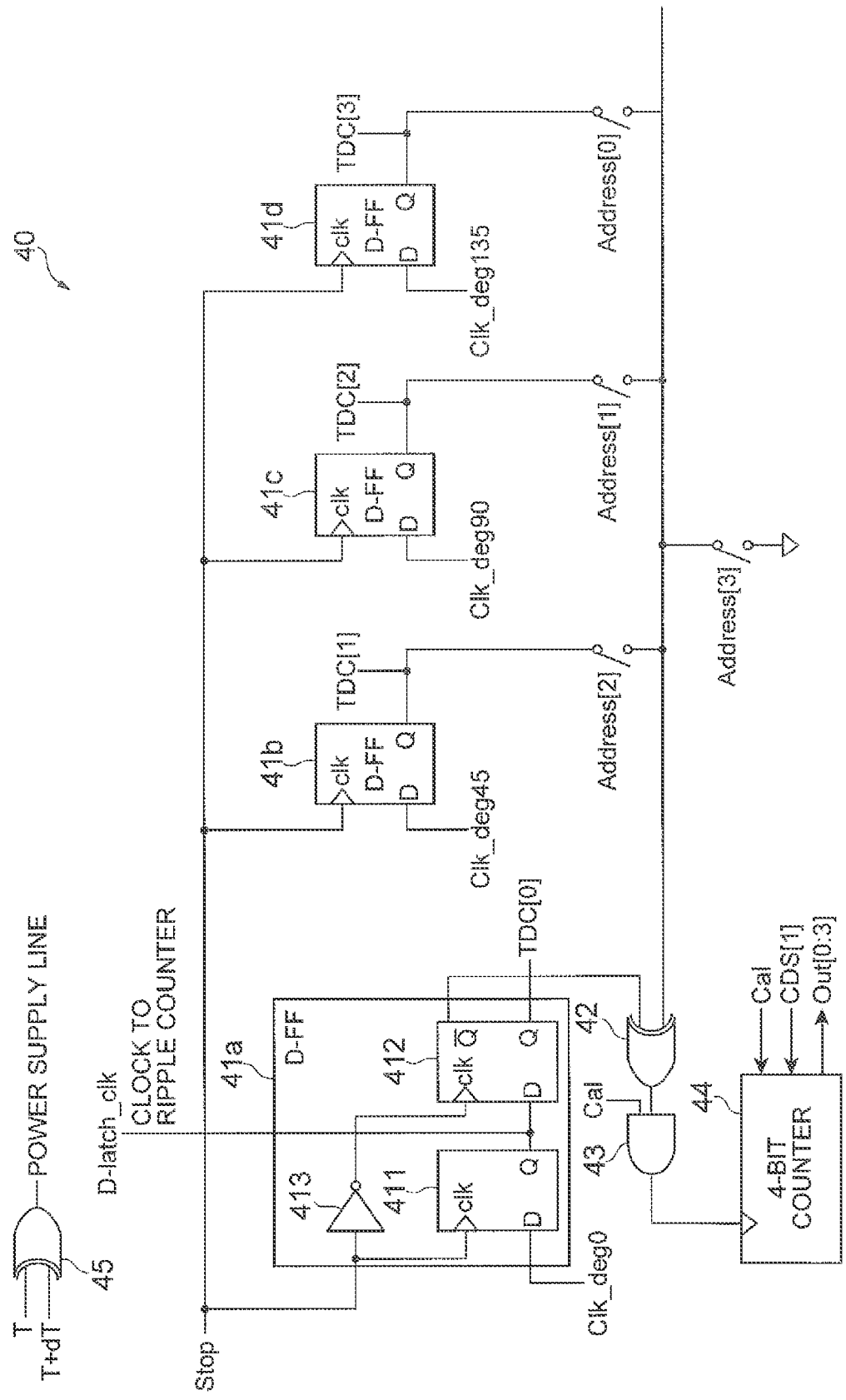
FIG. 4 illustrates a configuration of a Time to Digital Converter (TDC) in an integral type AD conversion circuit according to the present embodiment.

FIG. 4 illustrates a configuration of the TDC 40 in the integral type AD converter 1 according to the present embodiment. The TDC 40 includes four D-FFs 41a to 41d, an XOR gate 42, an AND gate 43, a 4-bit counter 44, and an XOR gate 45. The TDC corresponds to a circuit for measuring a time point when an output of the delay adjustment circuit 20 is inverted.

The D-FF 41a includes two D-latches 411 and 412 and one inverter 413. A data input port of the D-FF 41a is connected to an input port D of the D-latch 411. An output port Q of the D-latch 411 is connected to a data input port Q of the D-latch 412. Further, a clock input port of the D-FF 41a is connected to a clock input port of the D-latch 411 and an input port of the inverter 413 at the same time. An output port of the inverter 413 is connected to a clock input port of the D-latch 412. The D-FFs 41b to 41d have the same configuration as that of the aforementioned D-FF 41a. Further, the D-latch may be used instead of the D-FFs 41a to 41d.

The TDC 40 is configured as follows. A signal T+dT output from the delay adjustment circuit 20 is input to clock inputs of the four D-FFs 41a to 41d as a signal Stop. Further, four clock signals Clk_deg0, Clk_deg45, Clk_deg90 and Clk_deg135 generated by the DLL 50 described below and having phases different from each other by 45 degrees are input to data inputs of the D-FFs 41a to 41d, respectively. The output Q of the D-latch 411 is output to the ripple counter 30 as a clock D-latch_clk. An inverted output Qb of the D-FF 41a is connected to a first input of the XOR gate 42. The output ports Q of the D-FFs 41b to 41d are connected to a second input port of the XOR gate 42 via switches controlled by control signals Address[2] to Address [0]. Further, a reference electric potential GND is connected to the second input of the XOR gate 42 via a switch controlled by a control signal Address[3]. An output port of the XOR gate 42 and a signal Cal described below are input to two input ports of the AND gate 43, respectively. An output of the AND gate 43 is connected to a clock input of the 4-bit counter 44. The 4-bit counter 44 receives the signal Cal and a signal CDS[1] through input terminals, and outputs a 4-bit counter value Out[0:3]. Further, a comparison signal T output from the comparator 10 and the signal T+dT obtained by delaying the comparison signal T by the delay adjustment circuit 20 are input to two inputs of the XOR circuit 45, and a signal corresponding to an exclusive-OR operation of the comparison signal T and the signal T+dT is output to an electric power line used in the TDC 40. An operation of the TDC 40 will be described later.

Figure 5:
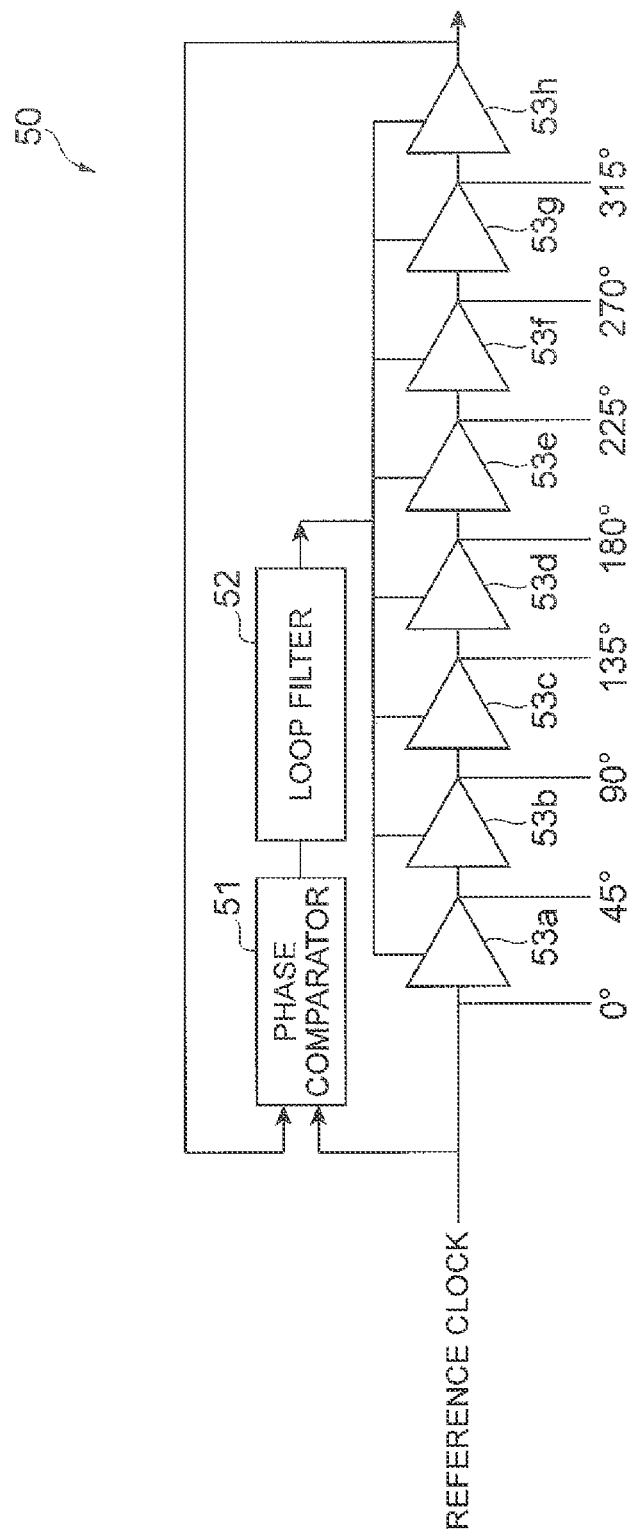
FIG. 5 illustrates a configuration of a Delay Locked Loop (DLL) in the integral type AD conversion circuit according to the present embodiment.

FIG. 5 illustrates a configuration of the DLL 50 in the integral type AD converter 1 according to the present embodiment. The DLL 50 includes a phase comparator 51, a loop filter 52, and eight unit delay circuits 53a to 53h. The eight unit delay circuits 53a to 53h are cascade-connected to each other. The phase comparator 51 compares a phase of a reference clock signal input to the DLL 50 with a phase of a clock signal output from the unit delay circuit 53h corresponding to the last stage, to output a signal having a magnitude corresponding to a difference between the two phases. The loop filter 52 corresponds to a filter circuit which low-passes and smoothes the signal output from the phase comparator 51. The unit delay circuits 53a to 53h are configured by, for example, cascade-connecting even number of inverters and delay phases of the input clocks. Further, the unit delay circuits 53a to 53h have delay control inputs for controlling delay of the clocks, respectively.

The DLL 50 operates such that a phase difference between the reference clock signal input to the DLL 50 and a signal output from the unit delay circuit 53h is 360 degrees. When the phase difference is larger than 360 degrees, the phase comparator 51 and the loop filter 52 output a signal decreasing the delays of the unit delay circuits 53a to 53h and making the phase difference close to 360 degrees to the delay control inputs of the unit delay circuits 53a to 53h. In contrast, when the phase difference is smaller than 360 degrees, the phase comparator 51 and the loop filter 52 output a signal increasing the delays of the unit delay circuits 53a to 53h and making the phase difference close to 360 degrees to the delay control inputs of the unit delay circuits 53a to 53h. In a normal state, a phase difference between the phase of the reference clock signal and the phase of the output signal of the unit delay circuit 53h is 360 degrees. At this time, phase differences between the reference clock signal and the output signals of the unit delay circuits 53a to 53h correspond to 0 degree, 45 degrees, 90 degrees, 135 degrees, 180 degrees, 225 degrees, 270 degrees and 315 degrees, respectively. In the present embodiment, four clock outputs of unit delay circuits 53a to 53d are output to the TDC 40.

The Schmitt trigger circuit 60 corresponds to a circuit for formatting a waveform of the clock D-latch_clk output from the TDC 40 to output the formatted clock D-latch_clk to the ripple counter 30.

Next, an operation of the integral type AD converter 1 will be described. First, when an AD conversion operation starts, changing of the reference voltage ramp starts, and a counting operation of the ripple counter 30 starts at the same time. Thereafter, when the magnitude relation between the analog input voltage yin and the reference voltage ramp is reversed, the comparison signal output from the comparator 10 is inverted (See FIG. 12). The TDC 40 starts an operation thereof at a time point when the comparison signal is inverted. Further, after a time dT following the inversion of the comparison signal, the output signal of the delay adjustment circuit 20 is also inverted. The TDC 40 stops the operation thereof at a time point when the output signal of the delay adjustment circuit 20 is inverted. Further, the ripple counter 30 also stops the counting operation thereof at the time point when the output signal of the delay adjustment circuit 20 is inverted. Although the result of the counting operation of the ripple counter 30 has been output to an output port Out2 of the ripple counter 30 at this time, the output value of the output port Out2 corresponds to a high-order bit of the result obtained by AD-converting the analog input voltage yin.

Figure 6:
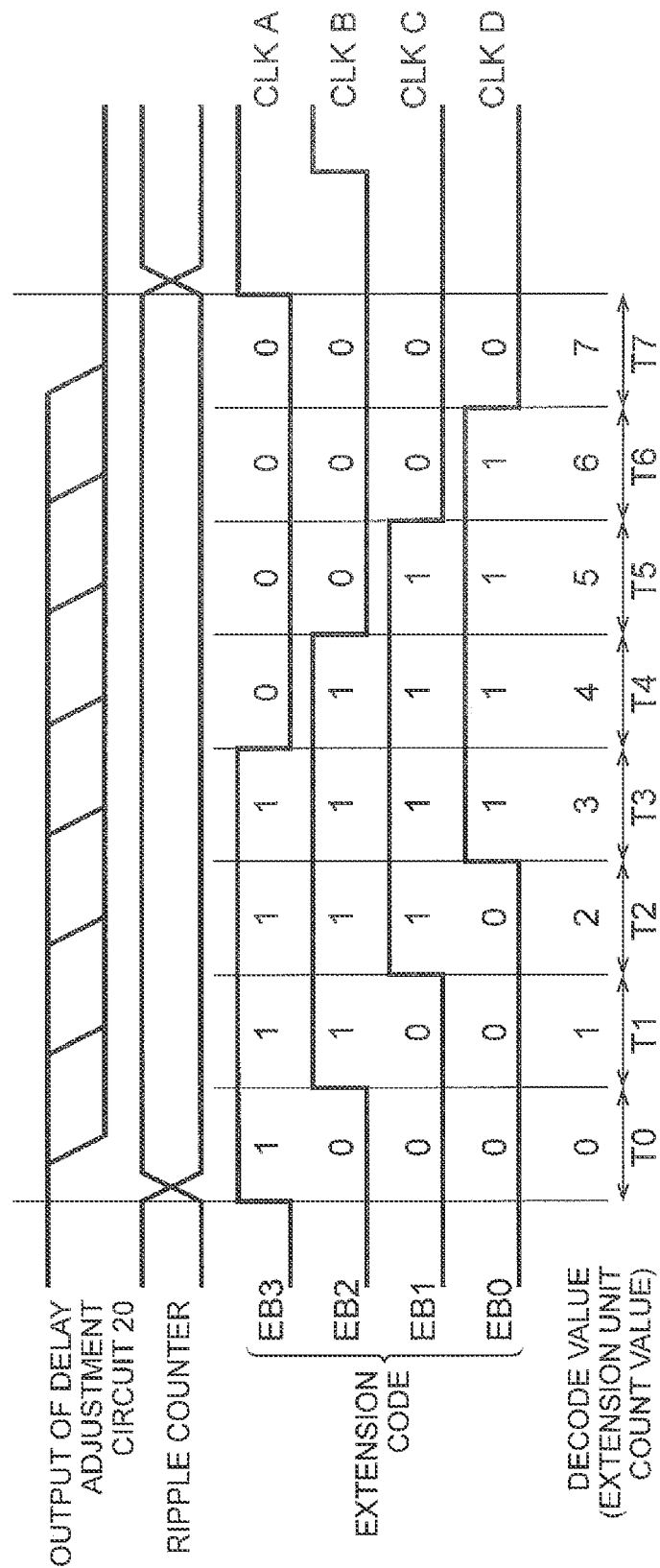
FIG. 6 illustrates a timing of an output of a comparator and an output value of the TDC, in the integral type AD converter according to the present invention.

An operation of the TDC 40 at the time point when the output signal of the delay adjustment circuit 20 is inverted will be described with reference to FIG. 6. The clocks CLKA, CLKB, CLKC and CLKD having phases different from each other by 45 degrees have been input from the DLL 50 to the TDC 40 as the clock signals Clk_deg0, Clk_deg45, Clk_deg90 and Clk_deg135. The TDC 40 latches values of the clocks CLKA to CLKD at the time point when the output signal of the delay adjustment circuit 20 is inverted, to make the latched values as extension codes EB3, EB2, EB1 and EB0, respectively. The extension codes EB3, EB2, EB1 and EB0 are equal to a TDC[0], a TDC[1], a TDC[2] and a TDC[3] of FIG. 4, respectively. For example, when the output signal of the delay adjustment circuit 20 is inverted within a time period T0 from rising of the clock CLKA to rising of the clock CLKB, the extension codes EB3 to EB0 are latched as "1000". The latched value "1000" is decoded as a decode value (extension unit count value) 0, which will be described below. A detailed description of the decoding operation will be described below. Likewise, when the output signal of the delay adjustment circuit 20 is inverted within a time period T1 from the rising of the clock CLKB to rising of the CLKC, the extension codes EB3 to EB0 are latched as "1100", and are decoded as a decode value 1. In this way, the clocks CLKA to CLKD are latched and decoded in accordance with the time point when the output signal of the delay adjustment circuit 20 is inverted.

Next, an example of the decoding operation of the extension codes EB3 to EB0 by the TDC 40 will be described with reference to FIG. 7. First, at a time point $T_1$, the clock signals Clk_deg0, Clk_deg45, Clk_deg90 and Clk_deg135 having four different phases are latched to the TDC[0] to TDC[3], respectively. At this time, a control signal Address[0:3] is set to "0000(0x0)".

Thereafter, at a time point $T_2$, the control signal Address[0:3] is set to "0001(0x1)", and a one clock pulse is input as the signal Cal at the same time. Then, the XOR gate 42 receives a value of the TDC[3], and outputs an exclusive OR of the value of the TDC[3] and the value of the inverted output port Qb of the D-FF 41a. Thus, when the TDC[0] is equal to 0, the value of the inverted output port Qb of the D-FF 41a is equal to 1, so that the XOR gate 42 outputs 1 when the TDC[3] is equal to 0. Meanwhile, when the TDC[0] is equal to 1, the value of the inverted output port Qb of the D-FF 41a is equal to 0, so that the XOR gate 42 outputs 1 when the TDC[3] is equal to 1. The AND gate 43 performs an AND operation of the output value of the XOR gate 42 and the signal Cal. Therefore, when the XOR gate 42 outputs 1, a pulse is output to a clock input port of the 4-bit counter 44, and a count value Out[0:3] of the 4-bit counter 44 increases by 1. Likewise, at a time point $T_3$, the control signal Address[0:3] is set to "0100(0x2)", and a one clock pulse is input as the signal Cal at the same time. Further, at a time point $T_4$, the control signal Address[0:3] is set to "0010(0x4)", and a one clock pulse is input as the signal Cal at the same time. In this way, the 4-bit counter 44, when the TDC[0] is equal to 1, counts the number of bits being 1, among 3 bits corresponding to the TDC[1] to the TDC[3], and when the TDC[0] is equal too 0, counts the number of bits being 0, among the 3 bits corresponding to the TDC[1] to the TDC[3].

Thereafter, at a time point $T_5$, the control signal Address[0:3] is equal to "0001(0x8)", and a four clock pulse is input as the signal Cal at the same time. Then, only when the TDC[0] is equal to 0 (that is, the value of the inverted output of the D-FF 41a is equal to 1), the value of the output of the XOR gate 42 becomes 1, so that the pulse for four clocks is output to the clock input port of the 4-bit counter 44. Therefore, the count value Out[0:3] of the 4-bit counter 44 increases by 4. Using the aforementioned processing, the decoding of the extension codes EB3 to EB0 (TDC[0] to TDC[3]) is completed.

Figure 7:
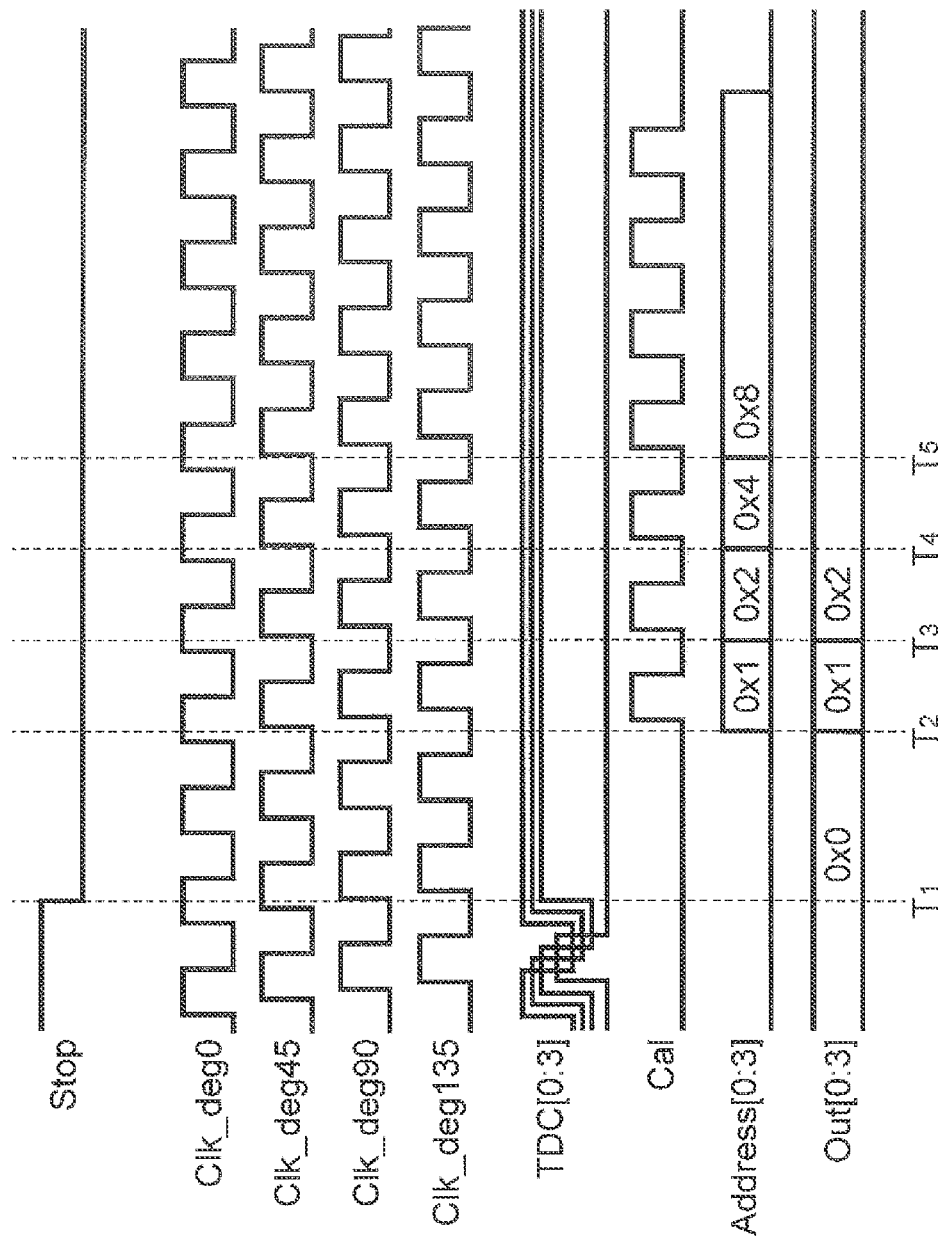
FIG. 7 is a timing diagram of the integral type AD converter according to the present invention.

An example where the TDC[0:3] is equal to "1110" is illustrated in FIG. 7, and finally, a value "2(0x2)" obtained after the decoding is output to the count value Out[0:3].

Figure 8:
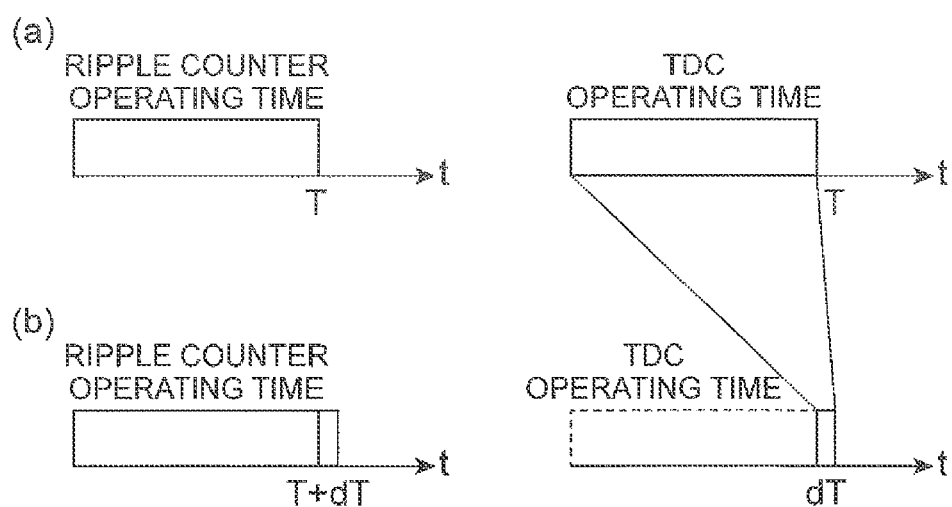
FIG. 8 schematically illustrates an operation time of the ripple counter and the TDC in the integral type AD converter according to the present invention.

In this way, in accordance with the integral type AD converter 1, the delay adjustment circuit 20 delays the comparison signal output from the comparator 10, by a time period corresponding to one period or more, to output the delayed comparison signal, and the TDC 40 starts an operation thereof at a time point when the output signal of the comparator is inverted, and stops the operation thereof at the time point when the output signal of the delay adjustment circuit 20 is inverted. As a result, the TDC 40 can be operated for a necessary time period which corresponds to one period of the main clock signal or more, so that power consumption can be reduced while improving at least one of a conversion accuracy and a conversion speed of the integral type AD converter 1. FIG. 8 schematically illustrates operation times of the ripple counter 30 and the TDC 40. FIG. 8(a) illustrates an integral type AD converter according to the related art, both the ripple counter 30 and the TDC 40 always operate until the time point T when the comparison signal output from the comparator 10 is inverted. On the other hand, in accordance with an integral type AD converter 1 according to the present e, the ripple counter 30 operates until the time point T+dT when the output signal output from the delay adjustment circuit 20 is inverted, but the TDC 40 operates during the time dT configured from the time point T and the time point T+dT, so that power consumption can be reduced.

Further, in the integral type AD converter 1, a delay line is installed at a rear end of the comparator 10 as the delay adjustment circuit 20, so that the comparator signal output from the comparator can be delayed using a simple configuration.

Figure 9:
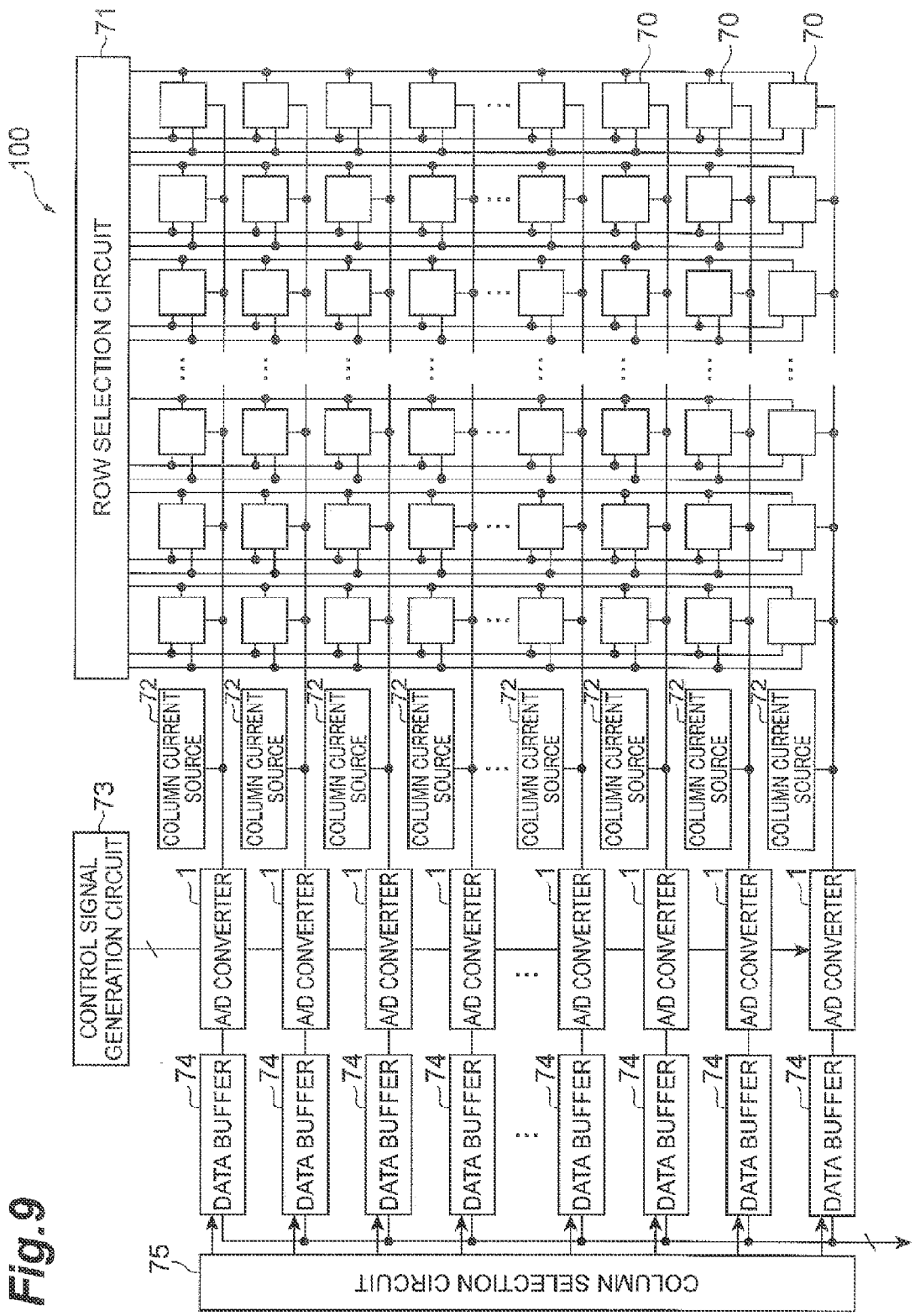
FIG. 9 illustrates a configuration of a Complementary Metal Oxide Semiconductor (CMOS) image sensor.

Next, a CMOS image sensor according to an embodiment of the present invention will be described with reference to FIG. 9. A CMOS image sensor 100 includes integral type AD converters 1, pixel circuits 70, a row selection circuit 71, column current sources 72, a control signal generation circuit 73, data buffers 74, and a column selection circuit 75. The pixel circuits 70 are installed to have a shape of a matrix with a plurality of rows and a plurality of columns. One integral type AD converter 1, one column current source 72, and one data buffer 74 are installed at each column of the pixel circuits 70.

The pixel circuits 70 correspond to circuits for converting an amount of incident light into a voltage to output the voltage. Various well-known configurations used for the CMOS image sensor can be employed as a configuration of the pixel circuits 70. The row selection circuit 71 corresponds to a circuit for selecting one row among the plurality of rows having the pixel circuits 70 installed therein, and outputting a voltage to the pixel circuits 70 in the selected row. The analog input voltage yin (See FIG. 1) input to the integral type AD converter 1 of each column corresponds to a voltage output by a pixel circuit 70 in the row selected by the row selection circuit 71 among the pixel circuits 70 arranged in the corresponding column and the column current source 72 in the row selected by the row selection circuit 71. The control signal generation circuit 73 corresponds to, for example, a circuit for generating a control signal (including a reference voltage ramp (See FIG. 1) having a ramp waveform) which allows the integral type AD converter 1 to start an AD conversion operation. The data buffer 74 corresponds to a circuit for retaining a low-order bit value Out1 (See FIG. 1) and a high-order bit value Out2 (See FIG. 1) which are output from the integral type AD converter 1.

In the CMOS image sensor 100 configured above, the pixel circuits 70 in the row selected by the row selection circuit 71 outputs a voltage corresponding to the incident light to the integral type AD converter 1. Further, the integral type AD converter 1 performs an AD conversion operation using the aforementioned operations, and outputs a digital value corresponding to the conversion result to the data buffer 74, and the data buffer 74 retains the digital value output from the integral type AD converter. Further, the column selection circuit 75 sequentially selects the data buffers 74 installed in accordance with each column of the pixel circuits 70, and outputs values which the selected data buffers 74 retain.

In this way, since the CMOS image sensor 100 according to the present embodiment includes the integral type AD converter 1 which can reduce the power consumption thereof while improving at least one of the conversion accuracy and the conversion speed, the overall power consumption can be reduced while improving an operation speed of the CMOS image sensor 100.

Figure 10:
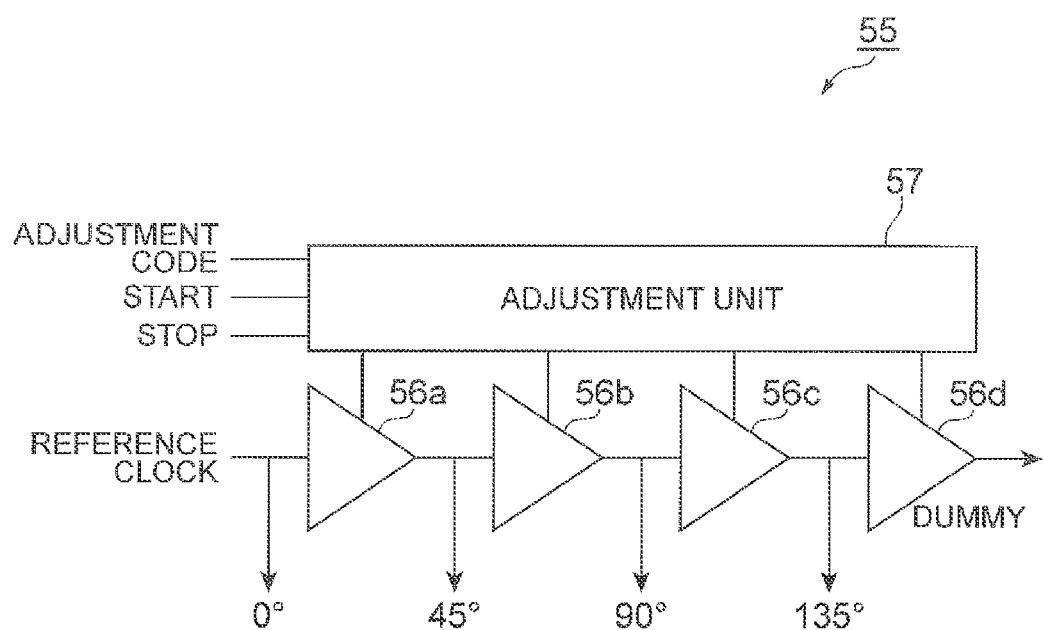
FIG. 10 illustrates a configuration of a delay line for generating multi-phase clock, in the integral type AD conversion circuit according to the present embodiment.
Figure 11:
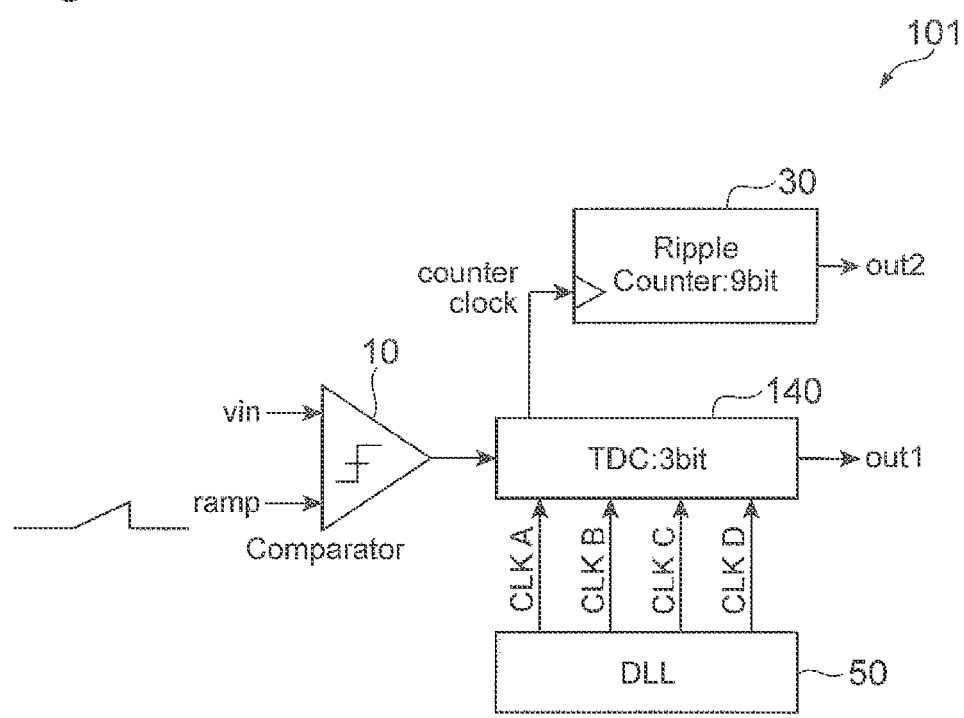
FIG. 11 illustrates a configuration of an integral type AD converter using a TDC according to the related art.

Further, the present invention is not limited to the above-mentioned embodiments. For example, when the integral type AD converter is configured, a Phase Locked Loop (PLL) having a differential ring oscillator with even number of stages or a delay line having a phase adjustment circuit may be employed as a multi-phase clock generation circuit instead of the DLL 50. Here, a configuration of the delay line having the phase adjustment circuit will be described with reference to FIG. 10. A delay line 55 includes unit delay circuits 56a to 56d and a phase adjustment circuit 57. For example, the unit delay circuits 56a to 56d are configured by cascade-connecting even number of inverters and delay phases of input signals by a unit time period. Further, each of the unit delay circuits 56a to 56d has an adjustment input port for adjusting a driving power to adjust a delay time between inputs and outputs of the unit delay circuits 56a to 56d. The phase adjustment circuit 57 has a START signal input port, a STOP signal input port and an adjustment code input port. The comparison signal T output from the comparator 10 is input to the START signal input port. The delay comparison signal T+dT output from the delay adjustment circuit 20 is input to the STOP signal input port. The phase adjustment circuit 57 receives the comparison signal T and the delay comparison signal T+dT to operate the delay line 55 during the time dT. Further, the phase adjustment circuit 57 has an adjustment output port for adjusting a delay time of the unit delay circuits 56a to 56d in accordance with the adjustment code which is input. The phase adjustment circuit 57 adjusts delay times of the unit delay circuits 56a to 56d in accordance with the input adjustment code so that the unit delay circuits 56a, 56b and 56c output clock signals of which the phases deviate from 45 degrees, 90 degrees and 135 degrees with respect to a reference clock input to the unit delay circuit 56a.

Further, a plurality of time to digital converters may be installed in the integral type AD converter. At this time, since a time point when the output signal of the delay adjustment circuit is inverted can be more accurately measured by supplying clock signals having different phases from the multi-phase clock generation circuit to the plurality of time to digital converters, the conversion accuracy of the integral type AD converter can be further improved.

Further, the TDC 40 may employ a logical circuit for directly converting the TDC[0:3] into the Out[3:0], as a configuration for decoding the TDC[0:3], instead of a configuration employing the XOR gate 42, the AND gate 43 and the 4-bit counter 44 according to the above embodiment. Further, the delay adjustment circuit 20 and the DLL 50 may employ various CMOS logical circuits such as a NAND gate of which one input port is fixed, etc. as an element for delaying a signal, instead of the inverter.

Further, the TDC 40 may be configured such that the delay adjustment circuit 20 may be cascade-connected to even number of the inverters 21. Otherwise, the TDC 40 may be configured such that the delay adjustment circuit 20 is cascade-connected to odd number of the inverters 21, and an NOR circuit is employed instead of the XOR circuit 45. Further, the TDC 40 may be configured such that the comparison signal vcomp output from the comparator 10 is inversed from the low level zone to the high level zone at the time point $t_{inv}$ by reversing the output polarity of the comparator 10 and the AND circuit is employed instead of the XOR circuit 45.

Further, the numbers of bits output from the ripple counter 30 and the TDC 40 are not limited to 9 bits and 3 bits, respectively. For example, the number of D-FFs 41 installed in the TDC 40 is increased to eight, and eight phase clocks output from the DLL 50 are configured to have eight phases different from each other by 22.5 degrees, so that a TDC which performs outputting of 4-bits can be obtained. When the outputting of the TDC 40 is changed from 3 bits to 4 bits, the conversion accuracy or the conversion speed of the integral type AD converter can be improved to two times. When the conversion accuracy of the integral type AD converter is fixed to 12 bits, the number of bits of the ripple counter 30 can be decreased from 9 bits to 8 bits by 1 bit, and a time period consumed for counting can be halved, so that the conversion speed of the integral type AD converter is doubled. Further, when the conversion speed of the integral type AD converter is fixed, the outputting of the TDC 40 is increased from 3 bits to 4 bits, so that the outputting of the integral type AD converter is increased from 12 bits to 13 bits by 1 bit together with the 9 bit outputting of the ripple counter 30. That is, the conversion accuracy of the integral type AD converter is doubled.

A circuit simulation for the conversion speed and the average power consumption of the integral type AD converter described above is performed. The circuit simulation is performed using a TSMC's 0.18 μm CMOS process. Further, both an integral type AD converter according to an embodiment and an integral converter according to a comparative example have outputs of 12 bits.

Table 1 illustrates a simulation result for an embodiment of the present invention and a comparative example.

TABLE 1

| Circuit topology (12 bits) | Sampling frequency | Average power consumption |
|---|---|---|
| Embodiment 1: Single slope ADC and TDC (3 bits) Nine D-FFs and four D-latches (corresponding to two D-FFs in size) | 1 MHz | 39.9 µW |
| Comparative example 1: Single slope ADC Twelve D-FFs | 125 kHz | 39.8 µW |
| Comparative example 2: Single slope ADC and TDC (3 bits) Nine D-FFs and four D-latches (corresponding to two D-FFs in size) | 1 MHz | 73.9 µW |

TABLE 2

| Circuit topology (12 bits) | Sampling frequency | Average power consumption |
|---|---|---|
| Embodiment 2: Single slope ADC and TDC(4 bits) Eight D-FFs and eight D-latches (corresponding to four D-FFs in size) | 2 MHz | 40.1 µW |
| Comparative example 1: Single slope ADC Twelve D-FFs | 125 kHz | 39.8 µW |
| Comparative example 3: Single slope ADC and TDC(4 bits) Eight D-FFs and eight D-latches (corresponding to four D-FFs in size) | 2 MHz | 107.6 µW |

An integral type AD converter according to an embodiment 1 of the present invention includes a 9-bit single slope type AD converter (single slope ADC) and a 3-bit TDC. The single slope type AD converter includes a counter having nine D-FFs illustrated in FIG. 3. The TDC has a configuration obtained by substituting the four D-FFs 41a to 41d illustrated in FIG. 4 to four D-latches, respectively. A sampling frequency of the integral type AD converter according to the embodiment 1 was 1 MHz, and an average power consumption thereof was 39.9 µW. Further, two D-latches have the same size as that of one D-FF obtained by arranging two D-latches.

Meanwhile, the integral type AD converter according to the comparative example 1 includes a 12-bit single slope type AD converter but does not include the TDC. The single slope type AD converter includes a counter having twelve D-FFs. A sampling frequency of the integral type AD converter according to the comparative example 1 was 125 kHz, and an average power consumption thereof was 39.8 µW.

An integral type AD converter according to a comparative example 2 corresponds to a single slope type AD converter according to the related art disclosed as the background technology. An integral type AD converter according to a comparative example 2 includes a 9-bit single slope type AD converter (single slope ADC) and a 3-bit TDC. The single slope type AD converter includes a counter having nine D-FFs. The TDC includes four D-latches (having the same size as that of two D-FFs). A sampling frequency of the integral type AD converter according to the comparative example 2 was 1 MHz, and an average power consumption thereof was 73.9 µW.

In this way, the integral type AD converter according to the embodiment 1 of the present invention has almost the same power consumption and the sampling frequency improved by eight times, as compared with the integral type AD converter according to the comparative example 1. Further, the integral type AD converter according to the embodiment 1 of the present invention has the same sampling frequency and the dramatically reduced power consumption, as compared with the integral type AD converter according to the comparative example 2. This is because, in the integral type AD converter according to the present invention, the power consumption of the TDC is very low and the power consumption consumed by the counter occupies most of the total power consumption.

Table 2 illustrates a simulation result for another embodiment of the present invention and a comparative example thereof. Further, Table 2 illustrates again the data of the comparative example 1 disclosed in Table 1 for comparison with the embodiment.

An integral type AD converter according to an embodiment 2 of the present invention includes an 8-bit single slope type AD converter (single slope ADC) and a 4-bit TDC. The single slope type AD converter includes a counter having eight D-FFs. The TDC includes eight D-latches (having the same size as that of four D-FFs). A sampling frequency of the integral type AD converter according to the embodiment 2 was 2 MHz, and an average power consumption thereof was 40.1 µW.

An integral type AD converter according to a comparative example 3 corresponds to a single slope type AD converter according to the related art disclosed as the background technology. The integral type AD converter according to the comparative example 3 includes an 8-bit single slope type AD converter (single slope ADC) and a 4-bit TDC. The single slope type AD converter includes a counter having eight D-FFs. The TDC includes eight D-latches (having the same size as that of four D-FFs). A sampling frequency of the integral type AD converter according to the comparative example 3 was 2 MHz, and an average power consumption thereof was 107.6 µW.

In this way, the integral type AD converter according to the embodiment 2 of the present invention has almost the same power consumption almost and the sampling frequency improved by 16 times as compared with the integral type AD converter according to the comparative example 1. Further, the integral type AD converter according to the embodiment 2 of the present invention has the same sampling frequency and the dramatically reduced power consumption, as compared with the integral type AD converter according to the comparative example 3.

Further, as can be seen in the embodiment 1 and the embodiment 2, in accordance with the present invention, when the resolving power of the TDC is improved, the sampling frequency can be improved while equally maintaining the power consumption. That is, the electric power efficiency is improved by improving the resolving power of the TDC. However, when the resolving power of the TDC is improved, the number of D-FFs or D-latches required for the TDC is increased, so that the scale of the circuit increases slightly.

Further, in the integral type AD converter according to an aspect of the present invention, the multi-phase clock generation circuit may further include one of a DLL, a PLL having a differential ring oscillator with even number of stages, and the delay line having the phase adjustment circuit. According to this configuration, a plurality of clock signals is generated by the DLL, the PLL having the differential ring oscillator with even number of stages or the delay line having the phase adjustment circuit, so that the time to digital converter can generate a plurality of latched clock signals by a simple configuration.

Further, in the integral type AD converter according to an aspect of the present invention, the delay adjustment circuit may employ a delay line installed at a rear end of the comparator. According to this configuration, the delay line is installed at the rear end of the comparator, so that the comparison signal output from the comparator can be delayed using a simple configuration.

Further, in the integral type AD converter according to an aspect of the present invention, a plurality of time to digital converters may be provided. According to this configuration, the time point when the output signal of the delay adjustment circuit is inverted can be more accurately measured using the plurality of time to digital converters, so that the conversion accuracy of the integral type AD converter can be further improved.

Further, in the integral type AD converter according to an aspect of the present invention, a Schmitt trigger circuit for formatting a waveform of a main clock signal to output the formatted main clock signal to a counter may be further provided. According to this configuration, even when the main clock signal latched by the time to digital converter holds a middle transient state in rising or falling thereof, the Schmitt trigger circuit formats the wave form of the main clock signal, thereby preventing malfunction of the ripple counter.

INDUSTRIAL APPLICABILITY

The present invention relates to the integral type AD converter and the CMOS image sensor, and can reduce the power consumption thereof while improving at least one of the conversion accuracy and the conversion speed.

| Reference Signs List | |
| --- | --- |
| 1, 101: Integral type AD converter | 10: Comparator |
| 20: Delay adjustment circuit | 21: Inverter |
| 30: Ripple counter (Counter) | 31a-31d: D-FF |
| 40: TDC (Time to digital converter) | |
| 41a-41d: D-FF | 42: XOR Gate |
| 43: AND Gate | 44: 4-bit counter |
| 45: XOR Gate | |
| 50: DLL(Multi-phase clock generation circuit) | |
| 51: Phase comparator | 52: Loop Filter |
| 53a-53h, 56a-56d: Unit delay circuit | 55: Delay line |
| 57: Phase adjustment circuit | 60: Schmitt trigger circuit |
| 70: Pixel circuit | 71: Row selection circut |
| 72: Column current source | |
| 73: Control signal generation circuit | |
| 74: Data buffer | 75: Column selection circuit |
| 100: CMOS image sensor | |

The invention claimed is:

1. An integral type Analog/Digital (AD) converter comprising:
a comparator configured to compare a reference voltage of a ramp waveform linearly changed according to a passing of time with an input voltage and output a comparison signal for the reference voltage and the input voltage;
a multi-phase clock generation circuit configured to generate a plurality of clock signals including a main clock signal and secondary clock signals, the secondary clock signals having respective phases different from a phase of the main clock signal, and the respective phases of the secondary clock signals being different from each other;
a delay adjustment circuit configured to delay the comparison signal output from the comparator by a time period longer than one period of the main clock signal, and output the delayed comparison signal;
a counter configured to count a time from starting of changing of the ramp waveform to an inversion of the outputting from the delay adjustment circuit, based on the signals output from the delay adjustment circuit and the main clock signal, and output the counted result as a high order bit; and
a time to digital converter configured to latch the plurality of clock signals generated by the multi-phase clock generation circuit at a time point when the output signal of the delay adjustment circuit is inverted and output a result obtained by decoding the corresponding latched value as a low-order bit,
wherein the time to digital converter is configured to start an operation thereof at the time point when the comparison signal output from the comparator is inverted, and stop the operation thereof at the time point when the output signal of the delay adjustment circuit is inverted after the low-order bit is output, and
wherein the integral type AD converter is configured to supply power to the time to digital converter only between the time point when the comparison signal output from the comparator is inverted and the time point when the output signal of the delay adjustment circuit is inverted.

2. The integral type AD converter according to claim 1, wherein the multi-phase clock generation circuit corresponds to one of a Delay Locked Loop (DLL), a Phase Locked Loop (PLL) having a differential ring oscillator with even number of stages, and a delay line having a phase adjustment circuit.

3. The integral type AD converter according to claim 1, wherein the delay adjustment circuit corresponds to a delay line installed at a rear end of the comparator.

4. The integral type AD converter according to claim 1, wherein the integral type AD converter comprises a plurality of time to digital converters.

5. The integral type AD converter according to claim 1, further comprising a Schmitt trigger circuit configured to format a waveform of the main clock signal to output the formatted waveform to the counter.

6. A Complementary Metal Oxide Semiconductor (CMOS) image sensor comprising the integral type AD converter according to claim 1.

* * * * *